(12) United States Patent
Shin et al.

(10) Patent No.: US 7,777,214 B2
(45) Date of Patent: Aug. 17, 2010

(54) PHASE CHANGE MEMORY DEVICE WITH A NOVEL ELECTRODE

(75) Inventors: Jae-Min Shin, Seoul (KR); Jong-Woo Ko, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/321,670

(22) Filed: Jan. 23, 2009

(65) Prior Publication Data
US 2009/0189141 A1 Jul. 30, 2009

(30) Foreign Application Priority Data
Jan. 25, 2008 (KR) .................... 10-2008-0007960

(51) Int. Cl.
*H01L 29/02* (2006.01)
(52) U.S. Cl. ............... 257/2; 257/3; 257/4; 257/5; 438/102; 438/103; 365/163
(58) Field of Classification Search ............ 257/1–5, 257/E29.002; 438/102–103; 365/163
See application file for complete search history.

(56) References Cited

U.S. PATENT DOCUMENTS

| 6,512,241 | B1 * | 1/2003 | Lai ............................ 257/4 |
| 6,670,628 | B2 | 12/2003 | Lee et al. |
| 6,746,892 | B2 | 6/2004 | Lee et al. |
| 2004/0077123 | A1 | 4/2004 | Lee et al. |
| 2004/0195604 | A1 * | 10/2004 | Hwang et al. ............ 257/295 |
| 2007/0210348 | A1 * | 9/2007 | Song et al. ............... 257/246 |
| 2008/0210922 | A1 * | 9/2008 | Lee et al. .................... 257/3 |

FOREIGN PATENT DOCUMENTS

| JP | 2003-332529 | 11/2003 |
| KR | 10-2005-0001169 A | 1/2005 |
| KR | 10-0655082 B1 | 12/2006 |

* cited by examiner

*Primary Examiner*—Bradley K Smith
*Assistant Examiner*—Jami M Valentine
(74) *Attorney, Agent, or Firm*—Mills & Onello, LLP

(57) ABSTRACT

A phase change memory device and a method of forming the same include a conductive pattern formed on a substrate. A lower electrode contact is disposed on the conductive pattern. The phase change pattern is disposed on the lower electrode contact. An upper electrode is disposed on the phase change pattern. An area of an upper surface of the lower electrode contact is smaller than an area of a lower surface of the lower electrode contact.

6 Claims, 7 Drawing Sheets

PHASE CHANGE MEMORY DEVICE WITH A NOVEL ELECTRODE

CROSS-REFERENCE TO RELATED APPLICATIONS

This U.S. non-provisional patent application claims priority under 35 U.S.C. §119 of Korean Patent Application No. 10-2008-0007960, filed in the Korean Intellectual Property Office on Jan. 25, 2008, the entire contents of which are hereby incorporated by reference.

BACKGROUND

The invention relates to a memory device, and more particularly, to a phase change memory device and a method of forming the same.

Due to developments in the electronics industry, characteristics such as fast read/write operation speed, non-volatility, and low operating voltage are required. Recently, a phase change random access memory (PRAM) having a phase change layer has been proposed as an advanced memory device capable of satisfying such requirements.

Since the phase change layer can indicate at least two differentiable states, for example a crystalline state and an amorphous state, and at least one intermediate state therebetween, it may be used as a memory element. The amorphous state indicates a relatively higher specific resistance than the crystalline state, and at least one intermediate state indicates a specific resistance between the amorphous state and the crystalline state.

SUMMARY

The present invention provides a phase change memory device having a lower electrode contact of an optimal structure.

The present invention also provides a method of forming a phase change memory device.

Embodiments of the present invention provide a phase change memory device including: a conductive pattern on a substrate; a lower electrode contact on the conductive pattern; a phase change pattern on the lower electrode contact; and an upper electrode on the phase change pattern. An area of an upper surface of the lower electrode contact is smaller than an area of a lower surface of the lower electrode contact.

In some embodiments, a contact surface between the lower electrode contact and the phase change pattern may be smaller than that between the lower electrode contact and the conductive pattern.

In other embodiments, a side wall of the lower electrode contact may have a uniform gradient. The lower electrode contact may have a cross-section of a trapezoid shape.

In still other embodiments, the lower electrode contact includes: a downward convex first portion contacting the conductive pattern; and a second portion disposed on the first portion to contact the phase change layer. A width of the second portion may be smaller than that of the first portion. The conductive pattern may have a concave upper surface.

In other embodiments, a method of forming a phase change memory device includes: forming a first interlayer dielectric including a conductive pattern on a substrate; forming a lower electrode contact on the conductive pattern; and forming a phase change pattern and an upper electrode on the lower electrode contact. An area of an upper surface of the lower electrode contact may be smaller than an area of a lower surface of the lower electrode contact.

In yet other embodiments, the forming of the lower electrode contact may include: forming a conductive layer on the first interlayer dielectric including the conductive pattern; forming a mask pattern on the conductive layer; and positive etching the conductive layer using the mask pattern as an etching mask.

In further embodiments, the forming of the lower electrode contact may include: forming a sacrificial pattern having an inclined side wall on the conductive pattern; forming a second interlayer dielectric surrounding the sacrificial pattern on the first interlayer dielectric; removing the sacrificial pattern selectively to form a gap region exposing the conductive pattern; and filling the gap region with a conductive material. The gap region may be filled with the conductive material by performing an electroless plating process or an atomic layer deposition process.

In even further embodiments, the forming of the lower electrode contact may include: forming a second interlayer dielectric having an opening exposing at least one portion of the conductive pattern on the first interlayer dielectric; etching an upper portion of the conductive pattern to form a concave region down the opening; and filling the concave region and the opening with a conductive material. The concave region may be filled with the conductive material by performing an electroless plating process or an atomic layer deposition process. The concave region may be formed by performing a wet etching process. An etching solution including ozone and hydrofluoric acid may be used in the wet etching process.

BRIEF DESCRIPTION OF THE FIGURES

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF EXAMPLE EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this description will be thorough and complete, and will fully convey the present invention to those skilled in the art.

It will be understood that although the terms "first" and "second" are used herein to describe various elements, these elements should not be limited by these terms. These terms are only used to distinguish one element from another element. It will also be understood that when a layer (or film) is referred to as being 'on' another layer or substrate, it can be directly on the other layer or substrate, or intervening layers may also be present. In the figures, the dimensions of layers and regions are exaggerated for clarity of illustration. In addition, the sizes of the elements and the relative sizes between elements may be exaggerated for further understanding of the present invention. Furthermore, shapes of the elements illustrated in the figures may vary with variations according to the fabrication process. Therefore, it will be understood that the embodiments disclosed in this specification includes some variations without limitations to the shapes as illustrated in the figures.

Figure 1:
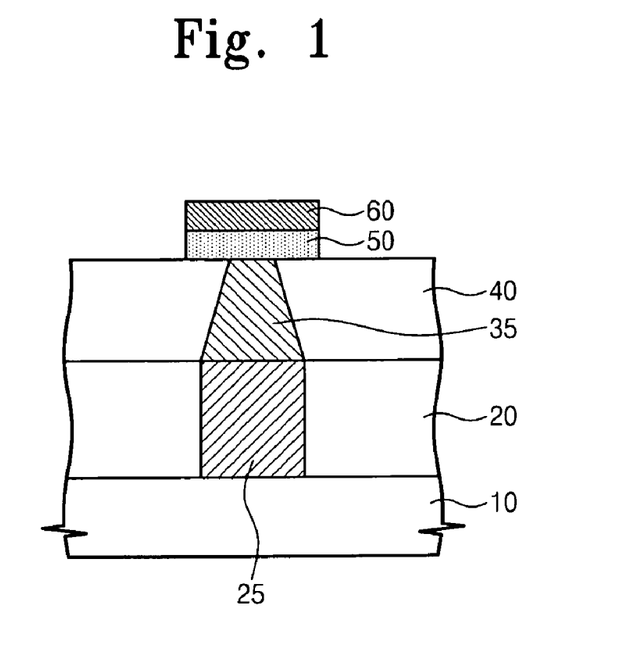
FIG. 1 is a schematic cross-sectional view illustrating a phase change memory device according to an embodiment of the present invention.

A phase change memory device according to an embodiment of the present invention will be described with reference to FIG. 1. A first interlayer dielectric 20 including a conductive pattern 25 is disposed on a substrate 10. For example, the substrate 10 may include one of various semiconductor substrates such as a silicon-on-insulator (SOI) substrate or a single crystal silicon substrate on which devices such as a transistor and/or a diode are formed. For example, the conductive pattern 25 may be a metal such as tungsten, or doped polysilicon, and the first interlayer dielectric 20, for example, may be silicon oxide.

A second interlayer dielectric 40 including a lower electrode contact 35 is disposed on the first interlayer dielectric 20 including the conductive pattern 25. The lower electrode contact 35 may be disposed on the conductive pattern 25 and be electrically connected to the substrate 10 through the conductive pattern 25. For example, the lower electrode contact 35 may be titanium (Ti) and/or titanium nitride (TiN).

Both side walls of the lower electrode contact 35 are inclined and may have a uniform gradient. That is, the cross-section of the lower electrode contact 35 may have a trapezoid shape, and the area of the upper surface of the lower electrode contact 35 is smaller than an area of the lower surface of the lower electrode contact 35.

A phase change pattern 50 and an upper electrode 60 are disposed on the lower electrode contact 35. For example, the phase change pattern 50 may include chalcogenide such as Ga—Sb, In—Sb, In—Se, Sb—Te, Ge—Te, Ge—Sb—Te (GST), Ge—Bi—Te (GBT), As—Sb—Te, As—Ge—Sb—Te, Sn—Sb—Te, In—Sn—Sb—Te, Ag—In—Sb—Te, periodic table 5A group element-Sb—Te, periodic table 6A group element-Sb—Te, periodic table 5A group element-Sb—Se, and periodic table 6A group element-Sb—Se, or may include chalcogenide doped with an impurity in the above-listed chalcogenide. For example, the impurity doped in the chalcogenide may include nitrogen, oxygen, silicon, or composition of these. The upper electrode 60, for example, may be titanium (Ti) and/or titanium nitride (TiN).

Figure 2:
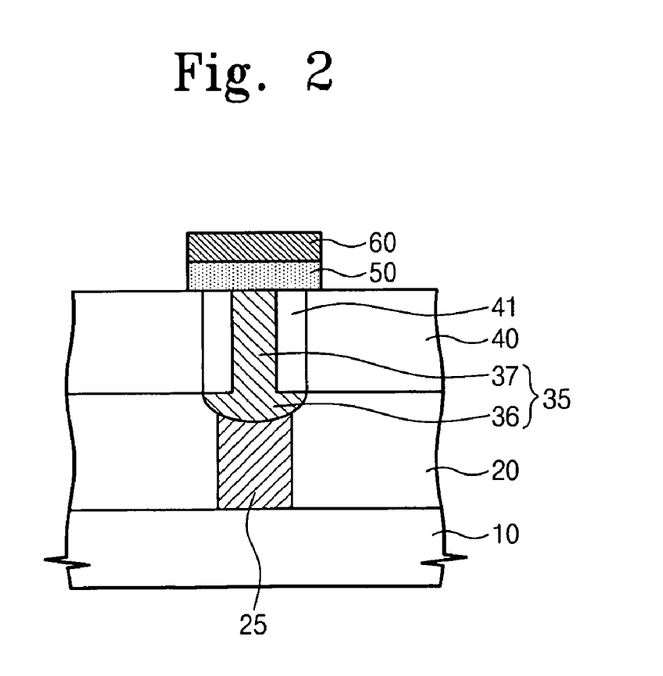
FIG. 2 is a schematic cross-sectional view illustrating a phase change memory device according to another embodiment of the present invention.

A phase change memory device according to another embodiment of the present invention will be described with reference to FIG. 2. Hereinafter, details regarding differences between the above-described embodiment and another embodiment of the present invention will be described.

in the embodiment of FIG. 2, the lower electrode contact 35 includes a downward convex first portion 36 of a lower portion and a second portion 37 of an upper portion. A convex lower surface of the first portion 36 contacts the conductive pattern 25, and an upper surface of the second portion 37 contacts the phase change pattern 50. An upper surface of the conductive pattern 25 may have a concave profile in correspondence with the convex lower surface of the first portion 36.

A spacer 41 may be interposed between the second portion 37 and the second interlayer dielectric 40. The spacer 41, for example, may be silicon nitride. The first portion 36 contacts a lower surface of the spacer 41, and may be expanded in a side direction. Accordingly, a width of the first portion 36 is larger than a width of the second portion 37.

The lower electrode contact 35 of the phase change memory device according to embodiments of the present invention has an area of a lower surface larger than an area of an upper surface. That is, since the area of the upper surface of the lower electrode contact 35 contacting the phase change pattern 50 is relatively small, embodiments of the present invention can reduce heat loss occurring in the contact surface between the lower electrode contact 35 and the phase change pattern 50, thereby enhancing heat efficiency. In addition, since the area of the lower surface of the lower electrode contact 35 contacting the conductive pattern 25 is relatively large, embodiments of the present invention are capable of reducing the parasitic resistance in the contact surface between the lower electrode contact 35 and the conductive pattern 25. Consequently, an optimal lower electrode contact can be implemented.

An embodiment of a method of forming a phase change memory device of FIG. 1 will be described with reference to FIGS. 3A to 3C.

Figure 3A:
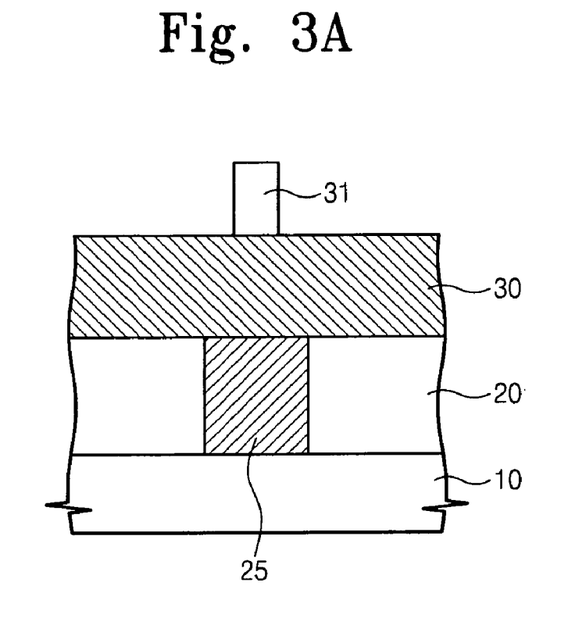
FIGS. 3A through 3C are schematic cross-sectional views illustrating an embodiment of a method of forming the phase change memory device of FIG. 1.

Referring to FIG. 3A, the first interlayer dielectric 20 including the conductive pattern 25 is disposed on the substrate 10. For example, the substrate 10 may comprise a semiconductor substrates such as a silicon-on-insulator (SOI) substrate or a single crystal silicon substrate on which devices such as a transistor and/or a diode are formed.

For example, the conductive pattern 25 may be a metal such as tungsten, or doped polysilicon, and the first interlayer dielectric 20, for example, may be formed of silicon oxide.

A conductive layer 30 is formed on the first interlayer dielectric 20 including the conductive pattern 25. For example, the conductive layer 30 may be formed of titanium (Ti) and/or titanium nitride (TiN). A mask pattern 31 is formed on the conductive layer 30. The mask pattern 31 may be formed of photoresist, oxide, nitride, or composition of these.

Figure 3B:
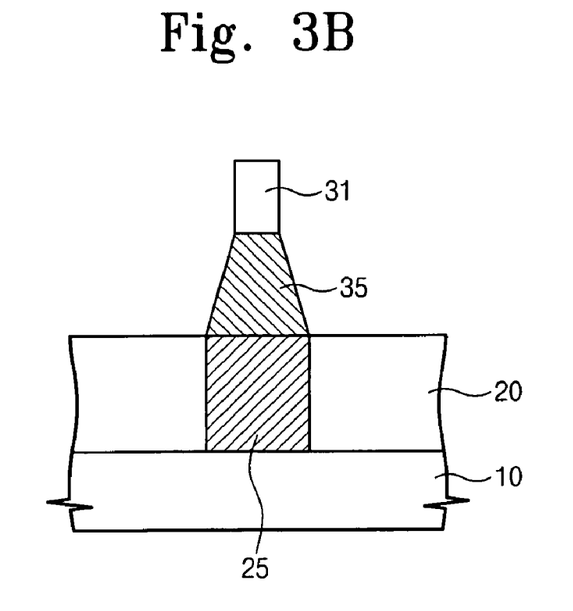

Referring to FIG. 3B, the conductive layer 30 is etched by performing an etching process using the mask pattern 31 as an etching mask, and the lower electrode contact 35 is formed on the conductive pattern 25. The etching process may be a positive etching process, and both side walls of the lower electrode contact 35 may be formed to be inclined by the positive etching process and may have a uniform gradient. That is, the cross-section of the lower electrode contact 35 may have a trapezoid shape, and an area of the upper surface of the lower electrode contact 35 is smaller than an area of the lower surface of the lower electrode contact 35.

Figure 3C:
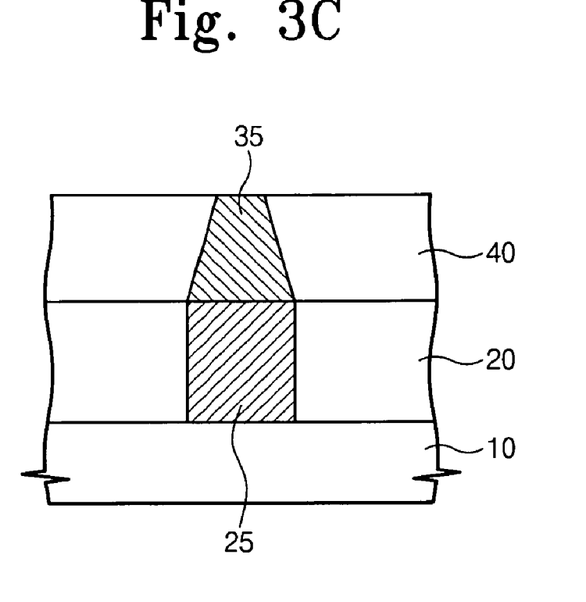

Referring to FIG. 3C, the second interlayer dielectric 40 surrounding the lower electrode contact 35 is formed on the first interlayer dielectric 20. The second interlayer dielectric 40 may be formed by performing a planarization process exposing the upper surface of the lower electrode contact 35 after forming a dielectric on the first interlayer dielectric 20. For example, the second interlayer dielectric 40 may be formed of silicon oxide. The planarization process, for example, may be a chemical mechanical polishing (CMP) process or a blanket anisotropic etching process.

Referring again to FIG. 1, the phase change pattern 50 and the upper electrode 60 are formed on the lower electrode contact 35. The phase change pattern 50 and the upper electrode 60 may be formed by patterning after forming a phase change layer and a conductive layer in order on the second interlayer dielectric 40 including the lower electrode contact 35.

For example, the phase change pattern 50 may be formed of chalcogenide such as Ga—Sb, In—Sb, In—Se, Sb—Te, Ge—Te, Ge—Sb—Te (GST), Ge—Bi—Te (GBT), As—Sb—Te, As—Ge—Sb—Te, Sn—Sb—Te, In—Sn—Sb—Te, Ag—In—Sb—Te, periodic table 5A group element-Sb—Te, periodic table 6A group element-Sb—Te, periodic table 5A group element-Sb—Se, and periodic table 6A group element-Sb—Se, or may be formed of chalcogenide doped with an impurity in the above-listed chalcogenide. For example, the impurity doped in the chalcogenide may include nitrogen, oxygen, silicon, or composition of these. The upper electrode 60, for example, may be formed of titanium (Ti) and/or titanium nitride (TiN).

Another embodiment of a method of forming a phase change memory device of FIG. 1 will be described with reference to FIGS. 4A to 4D.

Figure 4A:
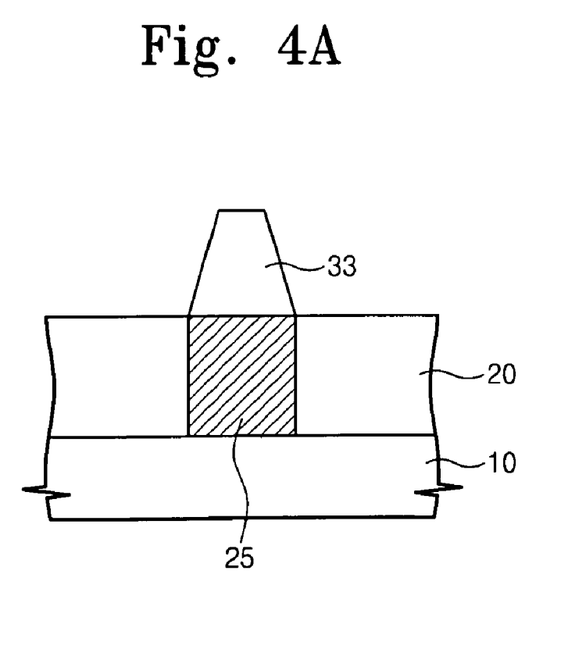
FIGS. 4A through 4D are schematic cross-sectional views illustrating another embodiment of the method of forming the phase change memory device of FIG. 1.

Referring to FIG. 4A, the first interlayer dielectric 20 including the conductive pattern 25 is formed on the substrate 10. For example, the substrate 10 may include a semiconductor substrate such as a silicon-on-insulator (SOI) substrate or a single crystal silicon substrate on which devices such as a transistor and/or a diode are formed. For example, the conductive pattern 25 may be formed of a metal such as tungsten, or doped polysilicon, and the first interlayer dielectric 20, for example, may be formed of silicon oxide.

A sacrificial pattern 33 is formed on the conductive pattern 25. The sacrificial pattern 33 may be formed by performing an etching process after forming a dielectric on the first interlayer dielectric 20 including the conductive pattern 25.

For example, the sacrificial pattern 33 may be formed of silicon nitride. The etching process may be a positive etching process, and both side walls of the sacrificial pattern 33 may be formed to be inclined by the positive etching process and may have a uniform gradient. That is, the cross-section of the sacrificial pattern 33 may have a trapezoid shape, and an area of the upper surface of the sacrificial pattern 33 is smaller than an area of the lower surface of the sacrificial pattern 33.

Figure 4B:
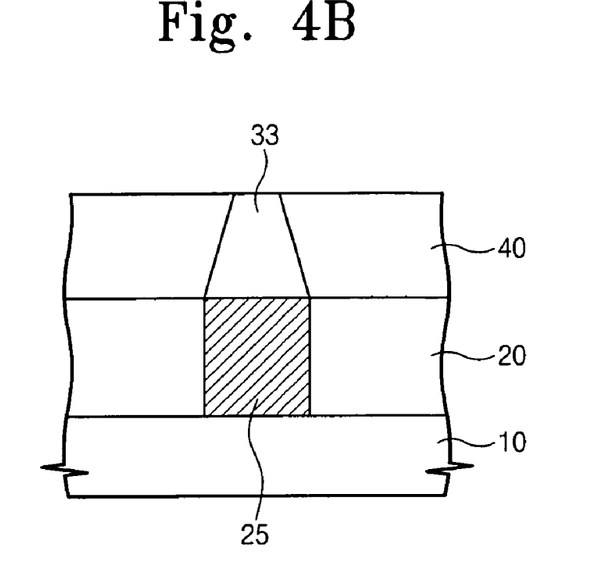

Referring to FIG. 4B, the second interlayer dielectric 40 surrounding the sacrificial pattern 33 is formed on the first interlayer dielectric 20. The second interlayer dielectric 40 may be formed by performing a planarization process exposing the upper surface of the sacrificial pattern 33 after forming a dielectric on the first interlayer dielectric 20. For example, the second interlayer dielectric 40 may be formed of silicon oxide. The second interlayer dielectric may be formed of a material having an etching selectivity with respect to the sacrificial pattern 33. For example, the second interlayer may be formed of silicon oxide. The planarization process, for example, may be a CMP process or a blanket anisotropic etching process.

Figure 4C:
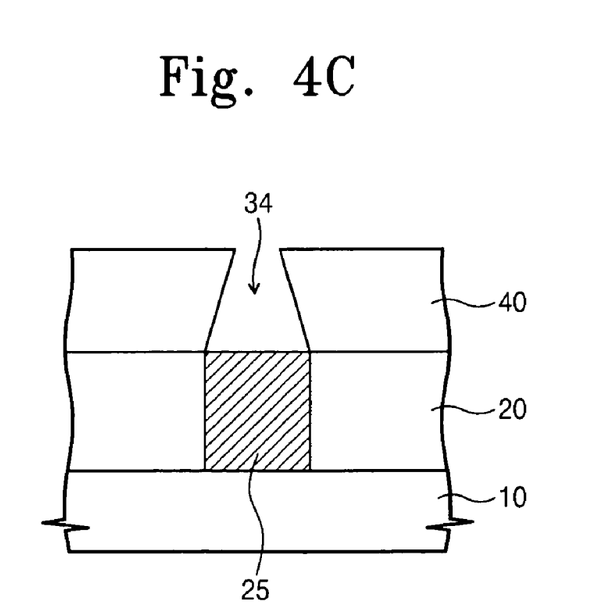

Referring to FIG. 4C, the sacrificial pattern 33 is selectively removed by performing an etching process, and a gap region 34 is formed which exposes the conductive pattern 25. The etching process may be a wet etching process, and an etching solution may be used which can selectively etch the sacrificial pattern 33 in the etching process. For example, in a case in which the sacrificial pattern 33 is formed of silicon nitride, the etching solution may be solution includes phosphoric acid.

Figure 4D:
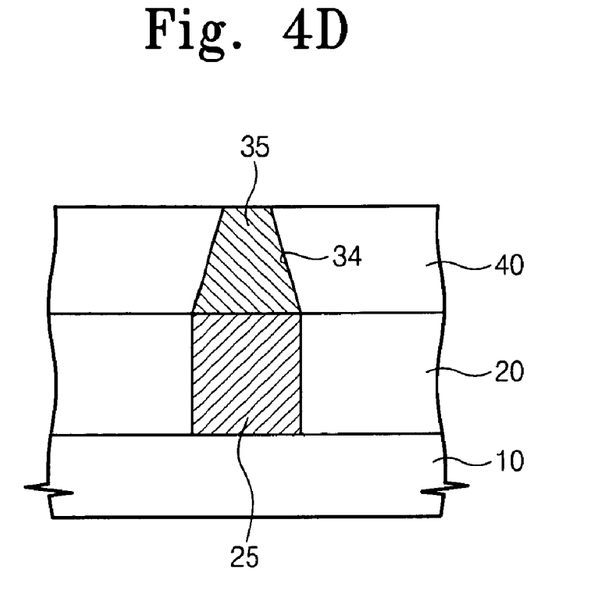

Referring to FIG. 4D, the lower electrode contact 35 is formed in the gap region 34. For example, the lower electrode contact 35 may be formed of titanium (Ti) and/or titanium nitride (TiN). The lower electrode contact 35, for example, may be formed by performing an atomic layer deposition (ALD) process or an electroless plating process. The electroless plating process may be a process which autocatalytically deoxidates a metal ion of a metal salt aqueous solution by a power of a certain reductant without receiving an external electric energy to thereby educe a metal on a surface of a treated material. A metal layer formed by the electroless plating process may be formed in isotropy. Moreover, the metal layer formed by the electroless plating process may selectively be formed on other metal layer. That is, the substrate 10 is exposed to a metal salt aqueous solution including a certain catalyst, and thus the lower electrode contact 35 may be formed which sufficiently fills the gap region 34. At this point, the lower electrode contact 35 can sufficiently be filled to the edge of the lower portion of the gap region 34 by the isotropy of the electroless plating process. Moreover, due to the selectivity of the electroless plating process, the lower electrode contact 35 may selectively be formed on the upper surface of the conductive pattern 25. The planarization process is performed after the ALD process or the electroless plating process, and thus the upper surface of the lower electrode contact 35 can be formed even with the height of the planarized upper surface of the second interlayer dielectric 40.

Referring again to FIG. 1, the phase change pattern 50 and the upper electrode 60 are formed on the lower electrode contact 35. The phase change pattern 50 and the upper electrode 60 may be formed by patterning after forming a phase change layer and a conductive layer in order on the second interlayer dielectric 20 including the lower electrode contact 35.

An embodiment of a method of forming a phase change memory device of FIG. 2 will be described with reference to FIGS. 5A to 5D.

Figure 5A:
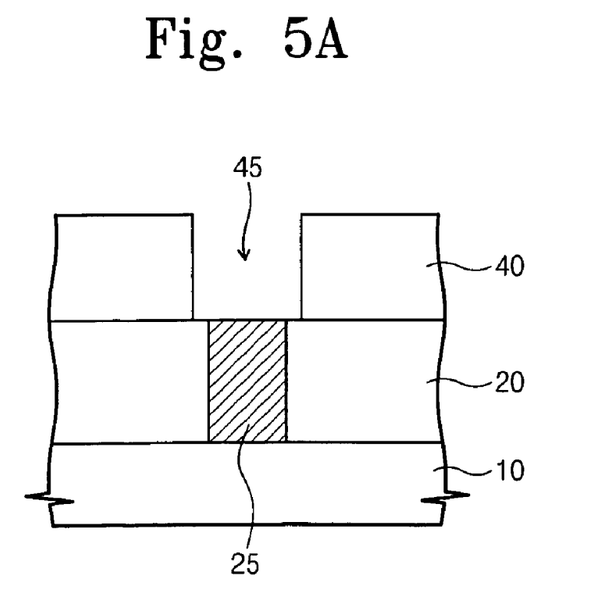
FIGS. 5A through 5D are schematic cross-sectional views illustrating an embodiment of a method of forming the phase change memory device of FIG. 2.

Referring to FIG. 5A, the first interlayer dielectric 20 including the conductive pattern 25 is formed on the substrate 10. For example, the substrate 10 may include semiconductor substrates such as a silicon-on-insulator (SOI) substrate or a single crystal silicon substrate on which devices such as a transistor and/or a diode are formed. For example, the conductive pattern 25 may be formed of a metal such as tungsten, or doped polysilicon, and the first interlayer dielectric 20, for example, may be formed of silicon oxide.

The second interlayer dielectric 40 is formed which has an opening 45 exposing the conductive pattern 25 on the first interlayer dielectric 20. For example, the second interlayer dielectric 40 may be formed of silicon oxide.

Figure 5B:
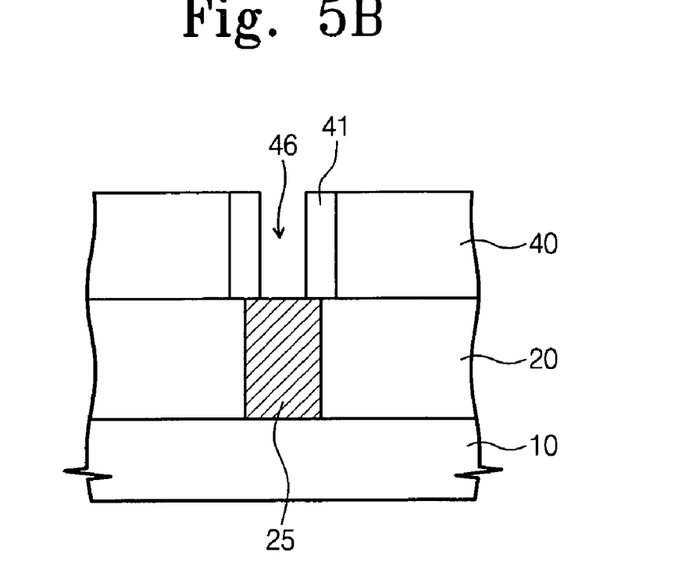

Referring to FIG. 5B, the spacer 41 is formed on the side wall of the second interlayer dielectric 40 defining the opening 45. The spacer 41 may be formed by performing a blanket anisotropic etching process after forming a dielectric on the whole surface of the substrate 10 where the opening 45 is formed. For example, the spacer 41 may be formed of silicon nitride. An opening 46 narrower than the opening 45 is defined by the spacer 41.

Figure 5C:
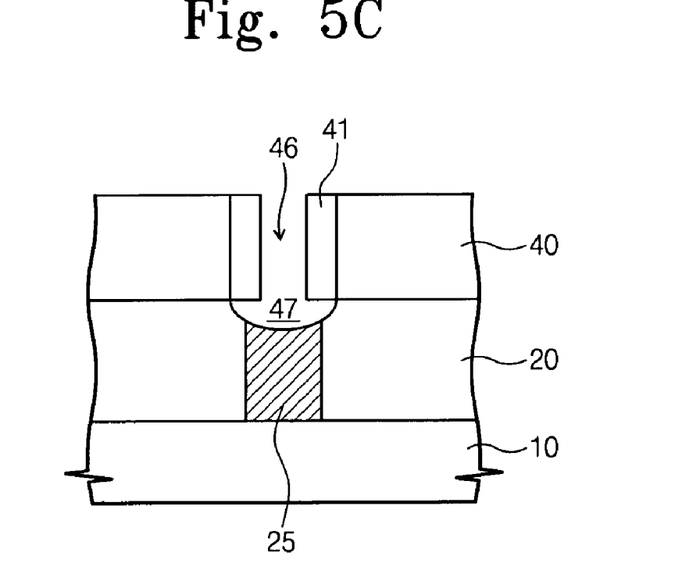

Referring to FIG. 5C, the upper portion of the conductive pattern 25 is etched by an etching process so that a concave region 47 down the opening 46 is defined. The upper surface of the conductive pattern 25 has a concave profile in correspondence with the concave region 47. The etching process may be a wet etching process using an etching solution including ozone ($O_3$) and hydrofluoric acid (HF).

Figure 5D:
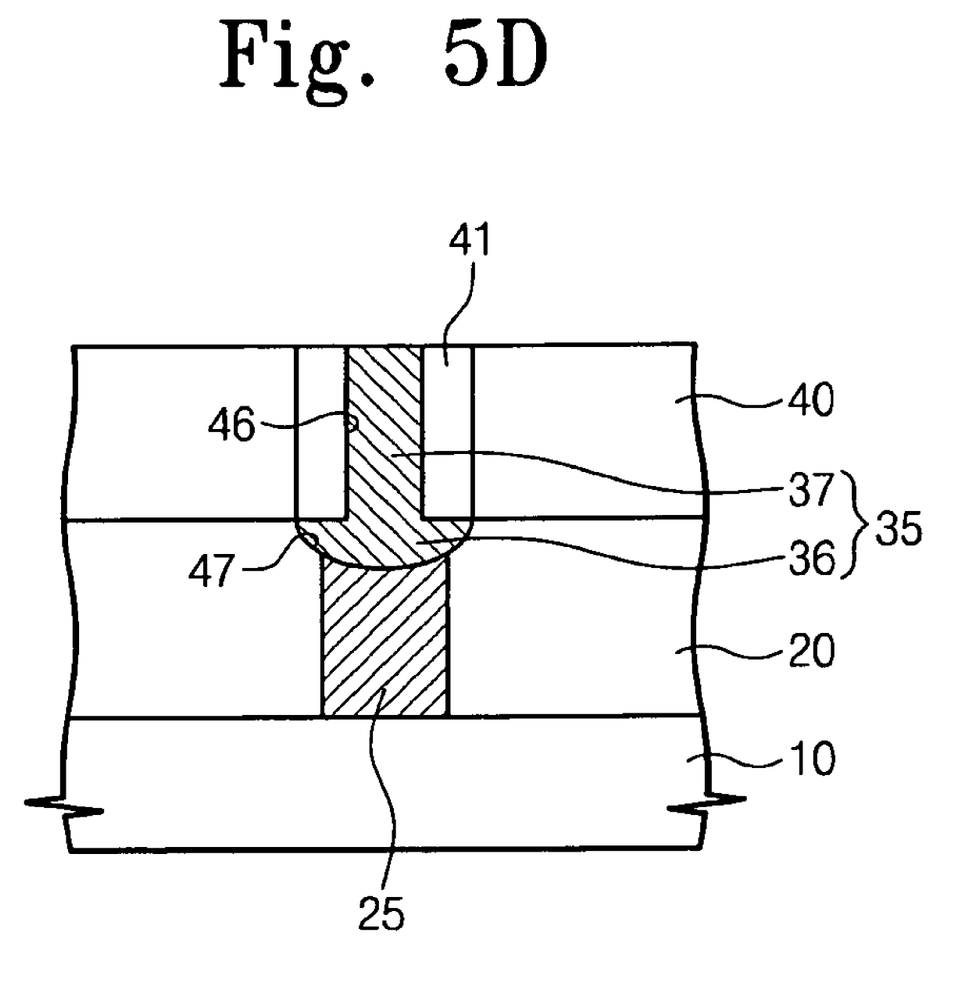

Referring to FIG. 5D, the lower electrode contact 35 is formed in the concave region 47 and the opening 46. The lower electrode contact 35 may include the convex first portion 36 corresponding to the concave region 47 and the second portion 37 corresponding to the opening 46. For example, the convex first portion 36 may be formed by performing an electroless plating process or an ALD process, and the second portion 37 may be formed by performing an electroless plating process, a chemical vapor deposition (CVD) process, or an ALD process. The lower electrode contact 35, for example, may be formed of titanium (Ti) and/or titanium nitride (TiN). The lower electrode contact 35 which sufficiently fills the concave region 47 can be formed by an electroless plating process. That is, the lower electrode contact 35 can sufficiently be filled to the edge of the concave region 47 down the spacer 41 by the isotropy of the electroless plating process. Moreover, due to the selectivity of the electroless plating process, the lower electrode contact 35 may selectively be formed on the upper surface of the conductive pattern 25. The planarization process is performed after the ALD process or the electroless plating process, and thus the upper surface of the lower electrode contact 35 can be formed even with the height of the planarized upper surface of the second interlayer dielectric 40.

Referring again to FIG. 2, the phase change pattern 50 and the upper electrode 60 are formed on the lower electrode contact 35. The phase change pattern 50 and the upper electrode 60 may be formed by patterning after forming a phase change layer and a conductive layer in order on the second interlayer dielectric 20 including the lower electrode contact 35.

Embodiments of the present invention can reduce heat loss occurring in the contact surface between the lower electrode contact and the phase change pattern because the area of the upper surface of the lower electrode contact contacting the phase change pattern is relatively small, thereby enhancing heat efficiency. In addition, embodiments of the present invention are capable of reducing the parasitic resistance in the contact surface between the lower electrode contact and the conductive pattern because the area of the lower surface of the lower electrode contact contacting the conductive pattern is relatively great. Consequently, an optimal lower electrode contact can be implemented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change memory device, comprising:
a conductive pattern on a substrate;
a lower electrode contact on the conductive pattern;
a phase change pattern on the lower electrode contact; and
an upper electrode on the phase change pattern,
wherein an area of an upper surface of the lower electrode contact is smaller than an area of a lower surface of the lower electrode contact, and
wherein the lower electrode contact comprises:
a downward convex first portion contacting the conductive pattern; and
a second portion disposed on the first portion to contact the phase change layer.

2. The phase change memory device of claim 1, wherein a contact surface between the lower electrode contact and the phase change layer pattern is smaller than that between the lower electrode contact and the conductive pattern.

3. The phase change memory device of claim 1, wherein a sidewall of the lower electrode contact has a uniform gradient.

4. The phase change memory device of claim 1, wherein a width of the second portion is smaller than that of the first portion.

5. The phase change memory device of claim 1, wherein the conductive pattern has a concave upper surface.

6. The phase change memory device of claim 1, wherein the first portion has a convex bottom surface contacting the conductive pattern.

* * * * *